United States Patent [19]

Huffman et al.

[11] 3,914,137

[45] Oct. 21, 1975

[54] METHOD OF MANUFACTURING A LIGHT COUPLED MONOLITHIC CIRCUIT BY SELECTIVE EPITAXIAL DEPOSITION

[75] Inventors: Tommie R. Huffman; Michael G. Coleman, both of Tempe, Ariz.

[73] Assignee: Motorola Inc., Chicago, Ill.

[22] Filed: Nov. 2, 1973

[21] Appl. No.: 412,083

Related U.S. Application Data

[62] Division of Ser. No. 186,883, Oct. 6, 1971, abandoned.

[52] U.S. Cl. ................ 148/175; 148/186; 148/187; 148/188; 357/19

[51] Int. Cl.$^{2}$ ........................................ H01L 7/36

[58] Field of Search ........... 148/175, 188, 186, 187, 148/174, DIG. 3, DIG. 4; 317/235 R, 235 N, 235 F; 250/211 J; 307/311; 65/43; 357/19

[56] References Cited

UNITED STATES PATENTS

| | | | |
|---|---|---|---|
| 3,283,221 | 11/1966 | Heiman | 317/235 |
| 3,478,215 | 11/1969 | Winstel et al. | 250/211 J |
| 3,551,761 | 12/1970 | Ruoff et al. | 317/235 |
| 3,636,358 | 1/1972 | Groschwitz | 250/211 J |
| 3,663,194 | 5/1972 | Greenstein et al. | 65/43 |
| 3,728,784 | 4/1973 | Schmidt | 148/188 |
| 3,766,447 | 10/1973 | Mason | 317/235 R |
| 3,791,882 | 2/1974 | Ogive | 148/174 |

OTHER PUBLICATIONS

Murray, L. et al.; *Lighting up in a Group*, in Electronics, Mar. 1968, pp. 104–110 [TK7800E58].

*Primary Examiner*—Walter R. Satterfield
*Attorney, Agent, or Firm*—Vincent J. Rauner; Henry T. Olsen

[57] ABSTRACT

There is disclosed a monolithic light coupled circuit and method of manufacture. In its elemental form, the monolithic circuit comprises a light or photo emitting diode and a light or photo sensitive diode formed integrally in a semiconductor chip with means for coupling the light from the photo emitting diode to the photo sensitive diode. Suitable leads are provided for connecting the photo emitting diode to an input circuit and the photo sensitive diode to an output circuit. In a more complex form, the monolithic structure may include a suitable discriminator detector circuit for the input and suitable driver amplifier circuit for the output.

7 Claims, 14 Drawing Figures

METHOD OF MANUFACTURING A LIGHT COUPLED MONOLITHIC CIRCUIT BY SELECTIVE EPITAXIAL DEPOSITION

This is a division of application Ser. No. 186,883, filed Oct. 6, 1971, and now abandoned.

BACKGROUND OF THE INVENTION

This invention relates to monolithic integrated circuits, and more particularly to a light coupled monolithic integrated circuit and method of manufacture.

There have been proposed various forms of light coupled circuits using conventional light sources, which circuits have the advantage of electrically decoupling an input circuit from an output circuit, thereby eliminating voltage transients and RF noise between input and output circuits. Such optical coupling arrangements would be advantageous in either a switching form wherein an input pulse merely directs a switching output pulse to a control circuit or for a linear coupling arrangement wherein a modulated input directs a modulated output. In the latter case particularly, conventional light sources, such as incandescent or discharge lamps, are not suitable, since the light intensity will not follow a modulated input voltage in a linear fashion, and in most cases, such optical coupling circuits are only suitable for a switching coupling arrangement wherein the conventional light source need be merely on or off. However, because the response speed of conventional sources of this type is quite slow, such circuits are unsuitable when high speed switching is required. Conventional lamp sources can respond in the low audio frequency range, but semiconductor light sources can faithfully follow frequencies well into the megahertz region.

The spectral distribution characteristic of standard sources is not necessarily matched to the spectral sensitivity of the available photo detectors. The radiant energy of these conventional sources is distributed over a broad band of wavelengths, and much of the energy produces light which is unnecessary to the detection action as not discernible by the photo detector. For example, a system utilizing a tungsten lamp operating at a color temperature of 2600° Kelvin and a silicon photo transistor detector, is approximately 23 percent effective, whereas a solid state emitter such as gallium arsenide is approximately 90 percent effective as an illuminator for a silicon photo transistor. Solid state devices are also much less fragile than their conventional counterparts and while the life of a conventional lamp is measured in thousands of hours, the life expectancy of a solid state emitter is measured in tens of years.

With all of the advantages of the solid state emitters and detectors, there have been several attempts at utilizing such devices in discrete arrangements to perform light coupled circuit functions. Such solutions have not been optimum because of the inherent disadvantages and costs of discrete packaging of components.

SUMMARY OF THE INVENTION

It is a primary object of this invention to provide a light coupled circuit in monolithic form.

A further object of the invention is to provide a light coupled circuit in monolithic form utilizing close coupling of the light emitted from a semiconductor photo emitter with the light detected by a solid state photo detector.

A still further object of the invention is to provide a method of producing heterogeneous semiconductor photo emitter photo detector monolithic structures.

A further object of the invention is to provide a process for readily manufacturing the aforementioned circuits in an expeditious, reproducible manner.

THE DRAWINGS

Further objects and advantages of the invention will be apparent to one skilled in the art from the following complete description of a preferred embodiment thereof, and from the figures, wherein.

While the following preferred embodiment of the invention is disclosed with particular reference to a monolithic heterogeneous combination of a gallium photo emitter with a silicon photo detector, it is to be appreciated that any optimum combination of light emitter and photo detector materials is contemplated by the invention.

Figure 1:
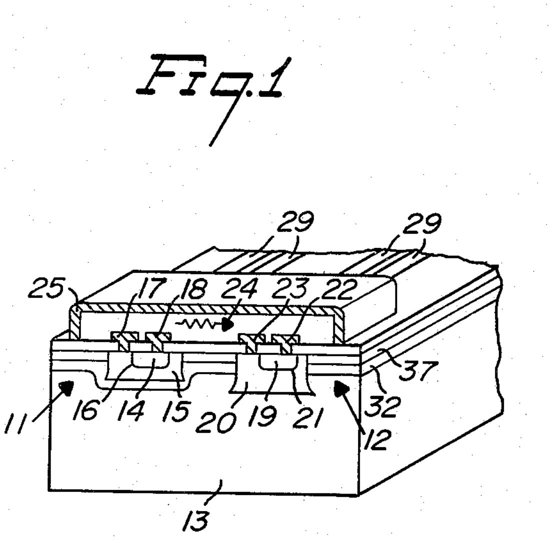
FIG. 1 is a perspective view partly in cross section of a monolithic light coupled integrated circuit device.

In accordance with preferred embodiment of the invention as shown in FIG. 1, the semiconductor integrated circuit device which may be a discrete unit or considered to be a portion of an integrated circuit includes a diode pair which comprises a light emitting diode 11 and a photo sensitive diode 12 mounted integrally in on a planar surface of a common substrate 13 but electrically isolated by dielectric layers 32 and 37 from each other while being optically or light coupled. The light emitting diode 11 comprises a P-conductivity region 14 and an N-conductivity region 15 defining a light emitting PN junction 16 extending to the surface. Suitable electric contacts 17 and 18 respectively contact the P- and N-conductivity regions to excite the diode to emit photons.

The photo sensitive diode 12 comprises a P-conductivity region 19 and an N-conductivity region 20 defining a photo sensitive PN junction 21 therebetween extending to the surface of the carrier 13. Suitable electrical contacts 22 and 23 respectively contact the P-conductivity region 19 and the N-conductivity region 20 for connecting a detected signal to an external circuit or to a portion of an integrated circuit. If the light coupled diode pair is made intergral with, for example, a driver circuit and an output amplifier, they may be connected together by metalization stripes 29. If the light coupled pair is to be packaged as a separate unit, the metallization stripes 29 can serve as bonding pads for connection of the device of the package.

To enhance transmission of the photons from the light emitting diode 11 to the photo sensitive diode 12, the diode pair may be convered with a suitable transparent insulating material 24 such as glass and the glass may in turn be covered with a layer of reflective material 25, such as aluminum or other suitable reflective material. Thus, an electrical signal coupled to the light emitting diode 11 will transmit photons to the light detecting diode 12 for activation of another portion of the circuit. This light coupled pair has the advantage that that portion of the circuit from which the signal is to be transmitted is completely electrically decoupled from that portion of the circuit which will receive the signal, thereby eliminating voltage transients and of noise from the output circuit. A further advantage of the light coupled pair is that the response time will be greater than for a standard electrically coupled circuit.

The carrier substrate 13 may be of any suitable material such as a semiconductor, a metal conductor, or an insulating material, the particular selection of material being based on several criteria. For example, one of the current limiting values for a light emitting diode and hence light output, will be based on the heat or power dissipation characteristic of the substrate. Thus, for maximum dissipation of heat from the light emitting diode, a good power dissipating metal conductor backing carrier 13 would be desirable so that the light emitting diode could be operated up to a maximum intensity. However, the devices must be maintained electrically isolated by an insulating material so that a backing carrier 13 composed entirely of such insulating material may eliminate a processing step. Grounding of capacitive charging of the substrate may be required to prevent slower speed of operation such that a semiconductive carrier would be the most desirable carrier.

The light emitting diode 11 is preferably a gallium phosphide crystal which emits in the infrared region at approximately 7000 angstroms, and the photo detecting diode 12 is preferably a silicon monocrystalline material which has a pack spectral response characteristic at approximately 8000 angstroms. Therefore, with the close matching of the emission and response characteristics, very low intensity signals from the emitter will be readily detected by the silicon photo detector, and therefore, very low energies will be required for operation of the coupling circuit.

Photons are produced in a light emitting diode by recombination of holes and electrons in the region of the PN junction. In the forward bias condition of the junction, when the diode is driven from an external energy source to produce photons, it is generally believed that the electron and hole recombination takes place mainly on the P side of the junction. Hence, for optimum operation of the emitting diode, the P region of the diode should be thin for maximum transmissivity of the photons produced therein, and obviously, the transparency of the diode material itself, to the wavelength of energy produced, should be as large as possible. Other than the transparency and directional losses of the light emitting diode, the primary loss of photons is due to refraction and reflection, since the angle at which a light ray will be refracted upon passing through an interface between two materials having different indices of refraction, is proportional to its angle of incidence at the interface and to the ratio of the indices of refraction of the two materials in accordance with Snell's Law $$n_i \sin \theta_i = n_e \sin \theta_e$$

where $\theta_i$ is angle of incidence (relative to normal to interface):

$\theta_e$ is angle of emergence;

$n_i$ is index of refraction of incidence media; and $n_e$ is index of refraction of emergence When the emergent angle $\theta_e$ becomes greater than 90°, the ray will be reflected. The incident angle at which reflection takes place, i.e., $\theta_e = 90°$, is termed the critical angle ($\theta_c$) which, from above, is $$\sin \theta_c = \frac{n_e}{n_i}$$

Since the index of refraction of gallium arsenide is relatively high, i.e., approximately 3.5, and assuming that the emergent media is air, which has an index of refraction of 1, the critical angle is equal to approximately 17°.

Even when a light ray strikes the interface at a normal angle, some losses occur which are a function of the respective media in accordance with reflection coefficient R $$R = \frac{(n_i - n_e)^2}{(n_i + n_e)^2}$$

From the forgoing, it will be readily seen that as the index of refraction of the material interfacing with the light emitting diode approaches the index of refraction of the gallium arsenide emitter, losses due to these reflectance factors will be greatly reduced. Therefore, the transparent insulating material 24, preferably has a relatively high index of refraction, preferably greater than 1.75, to increase the critical angle and reduce the reflection coefficient. Suitable glasses for this purpose are borosilicate glasses, high-lead glasses and arsenic-selenium-sulphur glasses. Because of the small distance between the light emitting diode and the photo sensitive diode, i.e., of the order of 25 microns, losses due to the transmissivity of the glass material should be relatively small.

Figure 2:
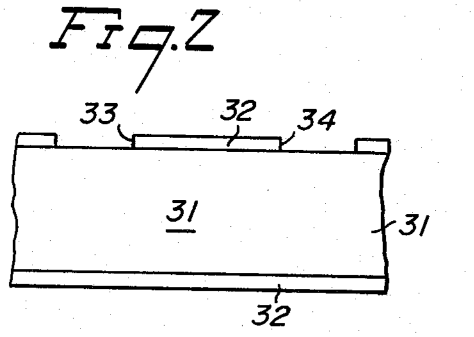
FIGS. 2–5 are partial sectional views of the device in the successive stages of the manufacture thereof.
Figure 3:
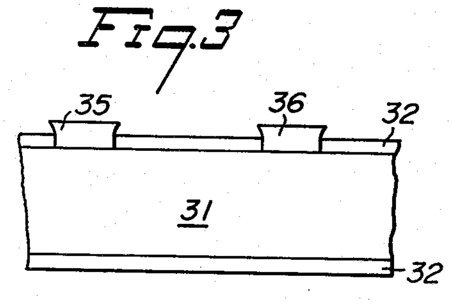
Figure 4:
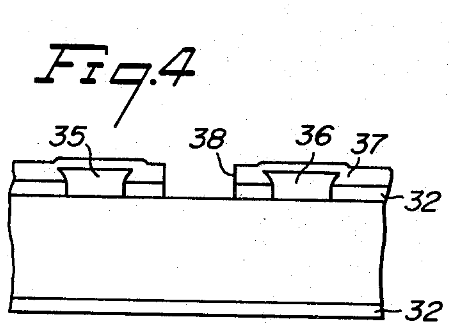
Figure 5:
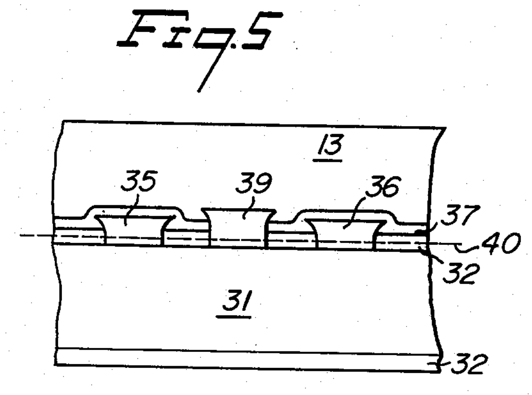

Successive steps in the processing of the foregoing device is depicted in FIGS. 2 to 5. As shown in FIG. 2, a suitable substrate 31 which may be of silicon or germanium or any suitable cubic lattice structure material, is utilized as a processing support. A dielectric masking layer of silicon dioxide, silicon nitride or aluminum oxide is deposited over the substrate and by suitable photoresist step, windows 33 and 34 are opened therein down to the substrate. As used herein, a photoresist step is intended to include placement, spreading and drying of a photo sensitive material, such as KMER, exposing of the photo sensitive material through suitable light mask, development and washing away of the undeveloped material and etching of the underlying material. Thereafter, by selective epitaxial technique, monocrystalline fillings 35 and 36 of, for example, III-V compounds, are placed in the windows 33 and 34 (FIG. 3). III-V compounds for the monocrystalline growths may be gallium phosphide, gallium arsenide gallium arsenide phosphide or other similar materials. The selective epitaxial process does not affect significant growth of the III-V compounds on the insulated layer 32, hence the monocrystalline material forms only in the windows. The III-V compounds sufficiently should match with the cubic lattice structure of the substrate so as to be an oriented monocrystalline growth. These monocrystalline growths 35 and 36 may be suitably doped in the epitaxial growth so as to form an N-conductivity region. After the epitaxial growth of the monocrystalline members 35 and 36, the entire substrate is again covered with a dielectric insulating layer 37, and utilizing another photoresist step, a window 28 is opened intermediate the previously formed epitaxial fillings 35 and 36. Again using selective epitaxial growth techniques, a monocrystalline growth 39 of a suitable composition, preferably silicon, is formed in the window 38 and the entire surface of the substrate covered to form supporting member 13, preferably of a polycrystalline silicon. If the starting substrate is of the proper conductivity silicon, a single diffusion may be only required to form the photo diode. Then the structure is lapped back to the dotted line 40 to remove all of the starting substrate 31 together with the protective layers of insulating material 32 and 37, thereby uncovering the monocrystalline fillings 35, 39 and 36. Then, by standard diffusion and metallization techniques, diffusions of P-type dopants are placed in the fillings to form the PN junctions 16 and 21 in fillings 36 and 39 respectively, and the contacts 17, 18 and 22 and 23 as shown in FIG. 1.

Figure 6:
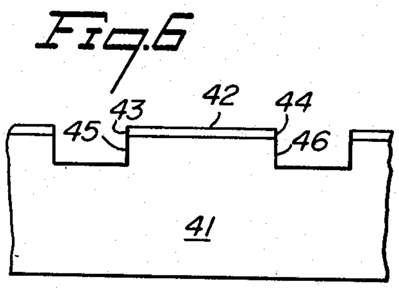
FIGS. 6–9 are partial sectional views of the device indicating successive stages of manufacture in accordance with another embodiment and FIGS. 10–14 are partial sectional views of a semiconductor integrated circuit at successive fabrication stages illustrating another embodiment of the present invention.
Figure 7:
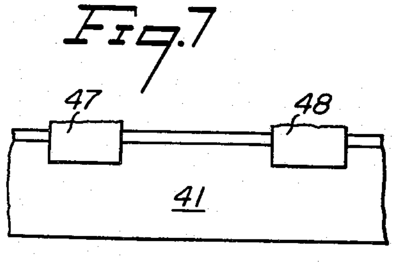
Figure 8:
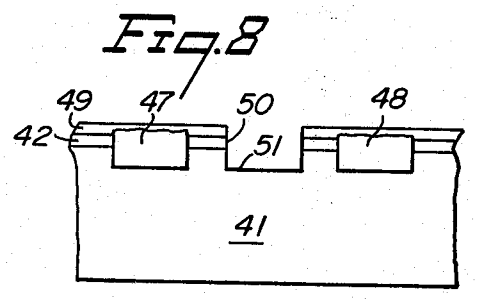
Figure 9:
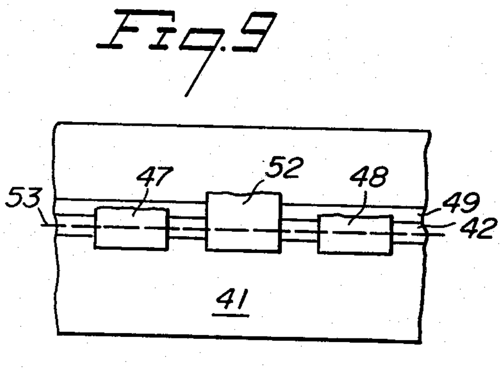

In accordance with another embodiment of the invention, the light coupling integrated circuit may be processed in accordance with the successive steps set forth in FIGS. 6–9. Thus, as shown in FIG. 6, a supporting substrate 41 is covered with a dielectric masking layer of silicon dioxide, silicon nitride or aluminum oxide, and by suitable photoresist step, windows 43 and 44 are opened therein. Then, utilizing the dielectric masking layer 42 as an etch mask, cavities 45 and 46 are made down into the processing support 41. Thereafter, by selective epitaxial techniques, monocrystalline fillings 47 and 48 are grown in the openings 45 and 46 and up through the windows 43 and 44 (FIG. 7). The fillings 47 and 48 and the processing support 41 are then covered with a second dielectric insulating layer 49, and by a photoresist step a window is opened through the dielectric layers 42 and 49. Then, with the dielectric layers 42 and 49 functioning as an etch mask, a cavity 51 is formed in this substrate intermediate the fillings 48 and 47. The cavity 51 and window 50 is then filled by a selective epitaxial technique to form the filling 52 (FIG. 9). The entire surface of the substrate is then covered with a suitable supporting substrate 13' and the original supporting substrate lapped off to the dotted line 63 to expose the fillings 47, 48 and 52 for diffusion and metallization processing to form the light emitting and light sensitive diodes 11 and 12 as before indicated.

Figure 10:
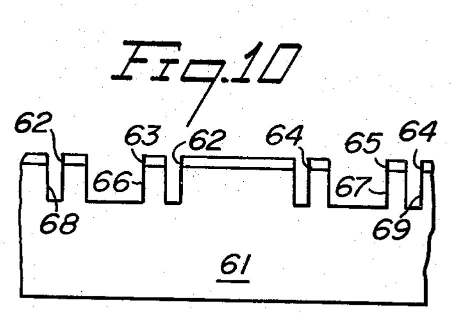
Figure 11:
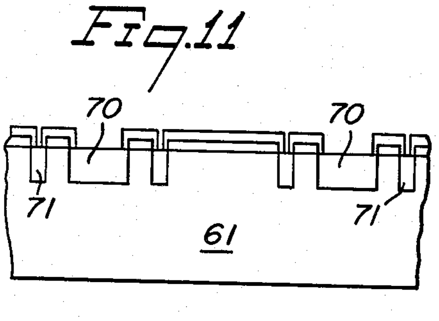
Figure 12:
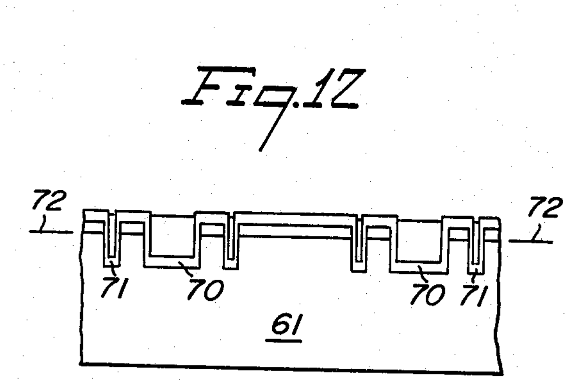
Figure 13:
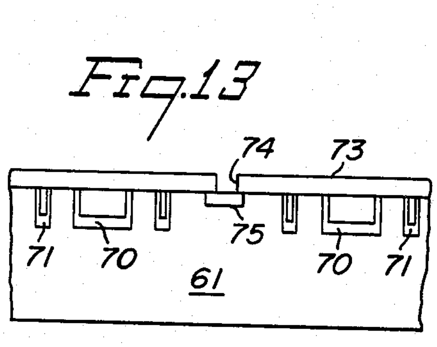
Figure 14:
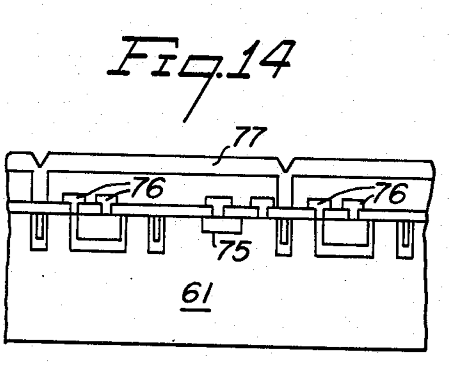

In accordance with a further embodiment of the invention, the light coupled integrated circuit may be produced in successive stages as shown in FIGS. 10–14. As depicted in FIG. 10, a substrate 61, preferably of N-type silicon, has windows 62, 63, 64 and 65 produced therein by a suitable photoresist step, the windows 62 and 64 surrounding the windows 63 and 65. The substrate 61 is then etched to form the cavities 66 and 67, and the isolation moats 68 and 69 therein. Subsequently, by selective epitaxial techniques, the isolation moats and the cavities are filled with a P-conductivity gallium phosphide (FIG. 11). After a suitable photoresist step which provides windows over the isolation moats 68 and 69 and the fillings 70 and 71 in the cavities 66 and 67, selective etch and refill technique is used to deposit N-type gallium phosphide in the isolation moats and in the fillings to provide PN junction isolation in the moat regions and PN junction, light emitting diodes in the filling region. The surface of the device is then lapped to the dotted line 72 (FIG. 12) and a new dielectric coating 73 produced thereover. By a suitable step a window 74 is opened intermediate the light emitting diode areas, and a P diffusion made in the silicon substrate 61 to form a light sensitive diode 75 (FIG. 13). By a suitable photoresist and metallization steps, contacts 76 are formed to the light emitting diodes and to the light sensitive diode and a suitable glass layer placed thereover to complete the structure. As before, a suitable reflecting coating 76 may be placed thereover, if desired, which coating may also serve as a grounding structure for the isolation rings.

It is thus seen there is provided a light coupled integrated circuit in a monolithic structure which is reliably and economically producible in accordance with mass production techniques. While in accordance with present preferred embodiment of the invention, a silicon detector having a peak spectral response at approximately 8000 angstroms is provided to match very well with a light emitter of gallium phosphide having a peak spectral emission at approximately the same wavelength; some other photo detectors and emitters may be used such as germanium, gallium arsenide or gallium arsenide phosphide. Also, while reference is made specifically to a photo detector diode, it is clearly contemplated that a photo transistor detector could be utilized or even a photo detecting Darlington amplifier. While as depicted the semiconductor monolithic circuit merely includes a photo emitter and a photo detector, the entire circuit could include suitable detector and/or discriminator circuits and suitable amplifying and driving circuits all in the same monolithic structure. Also the optically coupled circuit could include a plurality of either light emitters or detectors or both.

While certain preferred embodiments of the invention have been given by way of a specific disclosure thereof, it is obvious that suitable changes and modifications can be made without departing from the spirit and scope of the invention.

What is claimed is:

1. A process for the manufacture of a monolithic integrated circuit comprising the steps of:

a. growing a first monocrystalline semiconductor filling through a first dielectric layer on a monocrystalline substrate selected from the group consisting of germanium, silicon, and semiconductor grade III-V compounds;
b. depositing a second dielectric layer over said first monocrystalline filling;
c. growing a second monocrystalline semiconductor filling through first and second dielectric layers from said monocrystalline substrate;
d. depositing a carrier substrate over said second dielectric layer and said second monocrystalline filling;
e. removing said monocrystalline substrate and exposing said first and second monocrystalline fillings;
f. diffusing a conductivity effecting material into one of said monocrystalline fillings to produce a light emitting semiconductor junction; and
g. diffusing a conductivity effecting material into the other of said monocrystalline fillings to produce a light detecting junction.

2. A process as recited in claim 1 wherein said dielectric layers are of a material selected from the group consisting of silicon dioxide, silicon nitride and aluminum oxide.

3. A process as recited in claim 1 wherein said carrier substrate is polycrystalline silicon.

4. A process as recited in claim 1 wherein said monocrystalline substrate is removed by lapping.

5. A process as recited in claim 1 and further including the step of etching cavities into said monocrystalline substrate prior to growing said first and second semiconductor fillings in the openings through the dielectric layers.

6. A process for the manufacture of monolithic integrated circuit comprising the steps of:

a. forming a cavity in a monocrystalline silicon substrate;

b. etching an isolation moat in said monocrystalline silicon substrate surrounding the aforementioned cavity;

c. growing a monocrystalline semiconductor filling in said moat and said cavity of a first conductivity type;

d. etching and refilling at least a portion of said monocrystalline fillings in said cavity and said isolation moat with a monocrystalline material of a second semiconductor type;

e. diffusing a conductivity effecting type material into a portion of said silicon substrate at an area spaced from said monocrystalline filling to form a light detecting PN junction therein.

7. A process as recited in claim 6 wherein said monocrystalline filling material is gallium arsenide.

* * * * *